US012671375B2

(12) United States Patent
Liu et al.

(10) Patent No.: US 12,671,375 B2
(45) Date of Patent: Jun. 30, 2026

(54) ELECTRONIC CURRENT TUNING FOR QUIESCENT CURRENTS OF A GALLIUM NITRIDE BASED POWER AMPLIFIER

(71) Applicant: Quanta Computer Inc., Taoyuan City (TW)

(72) Inventors: Wen-Chin Liu, Taoyuan City (TW); Min-Yu Chen, Taoyuan City (TW); Ming-Chih Lin, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 548 days.

(21) Appl. No.: 18/325,780

(22) Filed: May 30, 2023

(65) Prior Publication Data

US 2024/0348215 A1     Oct. 17, 2024

Related U.S. Application Data

(60) Provisional application No. 63/495,400, filed on Apr. 11, 2023.

(51) Int. Cl.
*H03F 3/16*      (2006.01)
*H03F 3/24*      (2006.01)
*H04B 1/40*      (2015.01)

(52) U.S. Cl.
CPC ............... *H03F 3/245* (2013.01); *H04B 1/40* (2013.01); *H03F 2200/451* (2013.01); *H03F 2200/462* (2013.01)

(58) Field of Classification Search
CPC ............. H03F 3/16; H03F 3/191; H03F 3/195
USPC ........................................ 330/277, 302, 307
See application file for complete search history.

(56) References Cited

U.S. PATENT DOCUMENTS

| | | | | | |
|---|---|---|---|---|---|
| 3,657,660 | A | * | 4/1972 | Pfersch | G05B 1/027 |
| | | | | | 73/769 |
| 4,197,509 | A | * | 4/1980 | Curran | H03K 4/026 |
| | | | | | 327/135 |
| 4,823,054 | A | * | 4/1989 | Millauer | H02P 25/14 |
| | | | | | 318/245 |
| 7,497,615 | B2 | * | 3/2009 | Kim | G01K 7/16 |
| | | | | | 327/512 |

(Continued)

FOREIGN PATENT DOCUMENTS

TW          201613265 A      4/2016

OTHER PUBLICATIONS

TW Office Action for Application No. 112143411 mailed Mar. 5, 2025, w/ Summary, 4 pp.

(Continued)

*Primary Examiner* — Henry Choe
(74) *Attorney, Agent, or Firm* — Nixon Peabody LLP

(57)          ABSTRACT

A method and system for producing an adjustable resistor with a set resistance for adjusting quiescent current in a GaN transistor in a power amplifier. A quiescent current on the GaN power amplifier is measured via a test probe from a microcontroller unit on a test fixture. A resistance value is determined for output of a voltage bias value to adjust the quiescent current of the GaN transistor in the power amplifier. The resistance value is stored in an electronically adjustable resistor. The adjustable resistor is coupled to an output voltage circuit to provide voltage at the voltage vias value to a voltage bias input of the power amplifier.

15 Claims, 6 Drawing Sheets

(56)        References Cited

U.S. PATENT DOCUMENTS

| | | | |
|---|---|---|---|
| 9,041,472 B2* | 5/2015 | Chen | H01L 21/565 |
| | | | 330/307 |
| 10,714,165 B2* | 7/2020 | Bae | G11C 11/4074 |
| 11,018,500 B2* | 5/2021 | Wang | G09G 3/2092 |
| 2007/0188219 A1 | 8/2007 | Segarra | |
| 2014/0118074 A1 | 5/2014 | Levesque et al. | |
| 2016/0155500 A1* | 6/2016 | Chang | G11C 13/0064 |
| | | | 365/148 |

OTHER PUBLICATIONS

TW Search Report for Application No. 112143411 mailed Mar. 5, 2025, w/ First Office Action, 1 p.

* cited by examiner

Mechanical adjustable resistor

ELECTRONIC CURRENT TUNING FOR QUIESCENT CURRENTS OF A GALLIUM NITRIDE BASED POWER AMPLIFIER

CROSS-REFERENCE TO RELATED APPLICATIONS

This application claims priority from and benefit of U.S. Provisional Patent Application Ser. No. 63/495,400, filed on Apr. 11, 2023, which is hereby incorporated by reference herein in its entirety.

TECHNICAL FIELD

The present invention relates generally to power amplifier circuits, and more specifically, to an electronic tuning mechanism for a Gallium nitride (GaN) power amplifier.

BACKGROUND

Power amplifiers are used in power systems for computing devices and other related components such as 5G base stations. A traditional power amplifier is based on silicon transistors that act to amplify low power signals to a higher power. However, as more power intensive applications such as 5G components (e.g., radio units) are adopted, more efficient power amplifiers are required. One relatively new innovation is the employment of Gallium nitride (GaN) based power amplifiers. GaN is a new type of semiconductor technology that can be used in applications that require long-distance or high-power transmission of signals. Such signals require efficient amplification. GaN circuits are a good candidate for next-generation power devices as GaN based circuit can significantly outperform the traditional silicon-based power devices due to the higher breakdown strength, faster switching speed, and higher thermal conductivity of GaN transistors.

Such attributes are suitable for 5G base station applications and thus power amplifiers based on GaN technology are being employed. When the GaN power amplifier reaches a preset quiescent current, the corresponding gate voltage value will fluctuate within a certain range. Thus, the turn-on voltages of different batches of GaN transistors have fluctuation values within a certain range. This fluctuation is determined by the fabrication process of the GaN devices. Currently, all GaN based power amplifier chips in the industry experience this effect. Thus, the effects of quiescent current of the GaN based power amplifiers need to be adjusted for by applying a bias voltage to the gate of the GaN transistor to ensure the transistor properly turns on.

Traditional quiescent current adjustment methods include using a mechanical adjustable resistor to adjust the quiescent current manually; or using an electronic adjustable resistor to adjust the quiescent current through a control signal provided by a micro-controller unit (MCU) to control the adjustable resistor. FIG. 1A is a block diagram of a power system 10 that uses a prior art traditional mechanical adjustable resistor 12 to adjust quiescent current to a GaN power amplifier 14. A ground 16 is attached to one input of the resistor to set the reference voltage level to set a resistance value to divide the voltage. A power source is coupled through another resistor 18 to one end of the mechanical adjustable resistor 12. Another end of the mechanical adjustable resistor 12 is coupled to the GaN power amplifier 14. A smoothing capacitor 20 is coupled to the input of the GaN power amplifier 14. After the quiescent current is determined for the GaN transistor, the value of the mechanical adjustable resistor 12 is set manually to provide the bias voltage for proper adjustment to quiescent current.

The advantage of a mechanical adjustable resistor is the circuit for a mechanical adjustable resistor is simple, the trace routing space on the printed circuit board for the resistor is small, the adjustment method is intuitive, and the cost is lower. However, mechanical adjustable resistors require manual tunning of the resistor during the production process, prior to installation of the printed circuit board in the final product. Thus, this technique is not suitable to mass production because manual tuning cannot be automated.

FIG. 1B is a block diagram of a power system 50 that uses a prior art traditional electronic adjustable resistor 52 to provide bias voltage to adjust for quiescent current to a GaN power amplifier 54. The electronic adjustable resistor 52 is an integrated circuit that has inputs to adjust and set a resistance value. The resistance thus is varied between two pins 56 and 58. A power source is coupled through another resistor 60 to one end of the electronic adjustable resistor 52. Another end of the resistor 60 is coupled to the GaN power amplifier 54. A smoothing capacitor 62 is coupled to the input of the GaN power amplifier 54. The value of the electronic adjustable resistor 52 is set electrically to provide the proper adjustment to the quiescent current of the GaN transistor in the GaN power amplifier 54. In this prior art system, a micro-controller unit (MCU) 70 is coupled to a current sensor 72. The current sensor 72 measures the quiescent current from the GaN power amplifier 54. A power source 74 is coupled to the GaN power amplifier 54 to power the GaN power amplifier 54. The MCU 70 determines the appropriate resistance that will result in a bias voltage that adjusts the measured quiescent current. The MCU 70 has three outputs that are coupled to the electronic adjustable resistor 52 to adjust and set the resistance value that is then stored in an internal memory of the electronic adjustable resistor 52. The electronic adjustable resistor 52 is powered by a 5-volt source 76.

The advantage of the known power system 50 with the electronic adjustable resistor 52 is that the process of setting the resistance value can be automated and is thus suitable to mass production. The disadvantage is that the supporting MCU circuit and sensor circuit is complex as shown in FIG. 1B. Further, the required printed circuit board trace routing space is large. Numerous traces are required to control the electronic adjustable resistor and provide inputs and outputs to the MCU 70. Additional traces may result in interference in radio frequency signals in the traces from the power amplifier itself. Further additional traces for the components also increase production costs. Additional software is also required to control the MCU 70 and integrate the MCU 70 into the operation of a 5G component such as a radio unit.

Thus, there is a need for an adjustable resistor circuit for supporting GaN power amplifiers that can achieve the simplicity of a mechanical adjustable resistor and the automation of an electronic adjustable resistor. There is also a need for an adjustable resistor circuit for GaN power amplifiers that reduces the printed circuit footprint by minimizing components for setting the resistor value.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, an example power amplifier system is disclosed. The system includes a voltage source and a circuit board with an electronic variable resistor integrated circuit. The variable resistor integrated includes a preset resistance value coupled to the voltage source for outputting a bias voltage. A power amplifier includes a GaN transistor and a bias input coupled to the variable electronic resistor. The preset resistance value is determined by the quiescent current of the GaN transistor measured prior to installation of the power amplifier in an electronic device.

A further implementation of the example system is where the preset resistance value is stored in a memory on the electronic variable resistor integrated circuit. Another implementation is where a current sensor determines the quiescent current of the GaN transistor of the power amplifier. Another implementation is where the power amplifier includes an RF input and an RF output. An RF signal coupled to the RF input is amplified by the power amplifier. Another implementation is where the circuit board includes a measure point coupled to the electronic variable resistor integrated circuit allowing a micro-controller unit of a test fixture to set the predetermined resistance in the electronic variable resistor integrated circuit.

According to certain aspects of the present disclosure, an example transceiver device has a circuit board including a first electronic adjustable resistor and a first voltage output. A voltage source is coupled to the first electronic adjustable resistor to output a first predetermined bias voltage at the first voltage output. A first GaN power amplifier includes a GaN transistor and a bias voltage input to adjust for quiescent current of the GaN transistor. The bias voltage input is coupled to the first electronic adjustable resistor. The first electronic adjustable resistor is set at a first predetermined resistance value to produce the predetermined bias voltage. The first predetermined bias voltage value is determined by measuring a quiescent current of the GaN transistor of the first GaN power amplifier during production of the transceiver device.

A further implementation of the example transceiver device includes a first antenna transmitting an RF signal. The transceiver device is a 5G radio unit. The first GaN power amplifier includes an RF input and an RF output coupled to the first antenna. An RF signal coupled to the RF input is amplified by the power amplifier. Another implementation is where the transceiver has a second antenna and a second GaN power amplifier including a GaN transistor, an RF input, an RF output coupled to the second antenna, and a bias voltage input to adjust for a quiescent current of the GaN transistor. The circuit board includes a second electric adjustable resistor and a second voltage output. The bias voltage input of the second power amplifier is coupled to the second electronic adjustable resistor. The second electronic adjustable resistor is set at a second predetermined resistance value to produce a second predetermined bias voltage.

The second predetermined bias voltage value is determined by measuring the quiescent current of the GaN transistor of the second GaN power amplifier during production of the transceiver device. Another implementation is where the first predetermined resistance value is stored in a memory on the first electronic adjustable resistor. Another implementation is where a current sensor determines the quiescent current of the GaN transistor of the first GaN power amplifier during production of the transceiver device. Another implementation is where the circuit board includes a measure point coupled to the first electronic variable resistor allowing a micro-controller unit of a test fixture to set the predetermined resistance value in the first electronic variable resistor.

According to certain aspects of the present disclosure, an example method of setting an adjustable resistor for adjusting quiescent current in a GaN transistor in a power amplifier on a production component is disclosed. A quiescent current on the GaN power amplifier is measured via a current sensor on a test fixture. A resistance value for output of a bias voltage value to adjust for the quiescent current of the GaN transistor in the GaN power amplifier is determined. The resistance value is stored in an electronic adjustable resistor. The electronic adjustable resistor is coupled an output voltage circuit to provide voltage at the bias voltage value to a voltage bias input of the power amplifier.

A further implementation of the example method is where the power amplifier includes an RF input and an RF output. An RF signal is amplified by the power amplifier. Another implementation is where the production component is a 5G radio unit. Another implementation is where the production component is one multiple production components. The measuring, determining, and storing are performed by the test fixture as part of a production system.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1A:
FIG. 1A is a circuit diagram of a prior art mechanical adjustable resistor for controlling quiescent current of a GaN power amplifier.
Figure 1A:
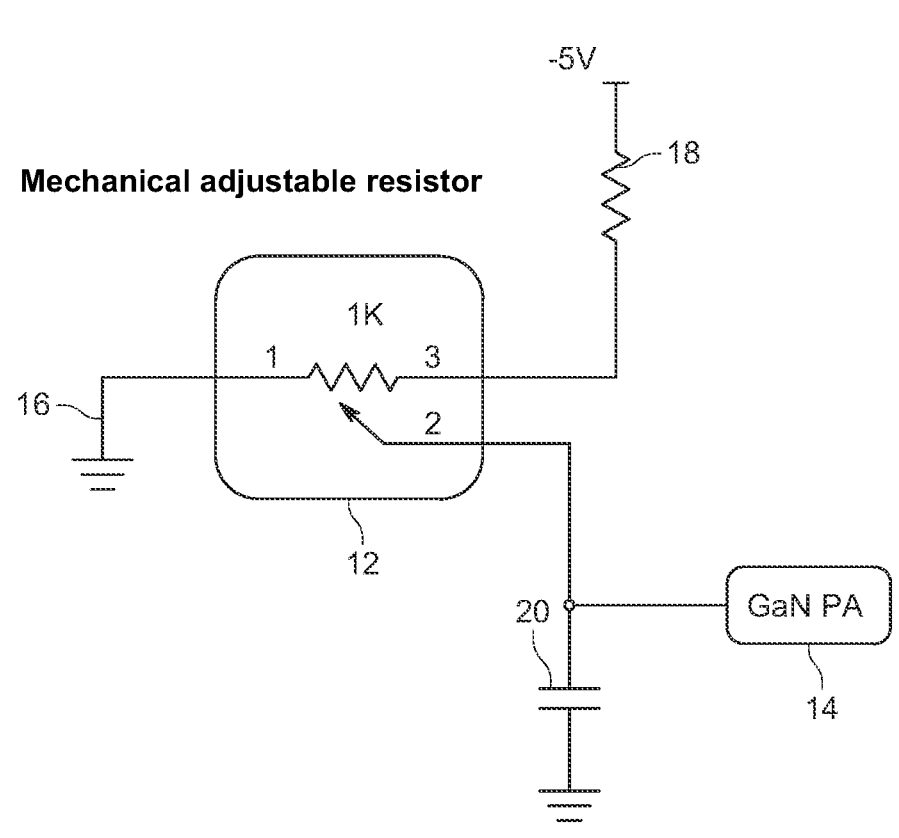
Figure 1B:
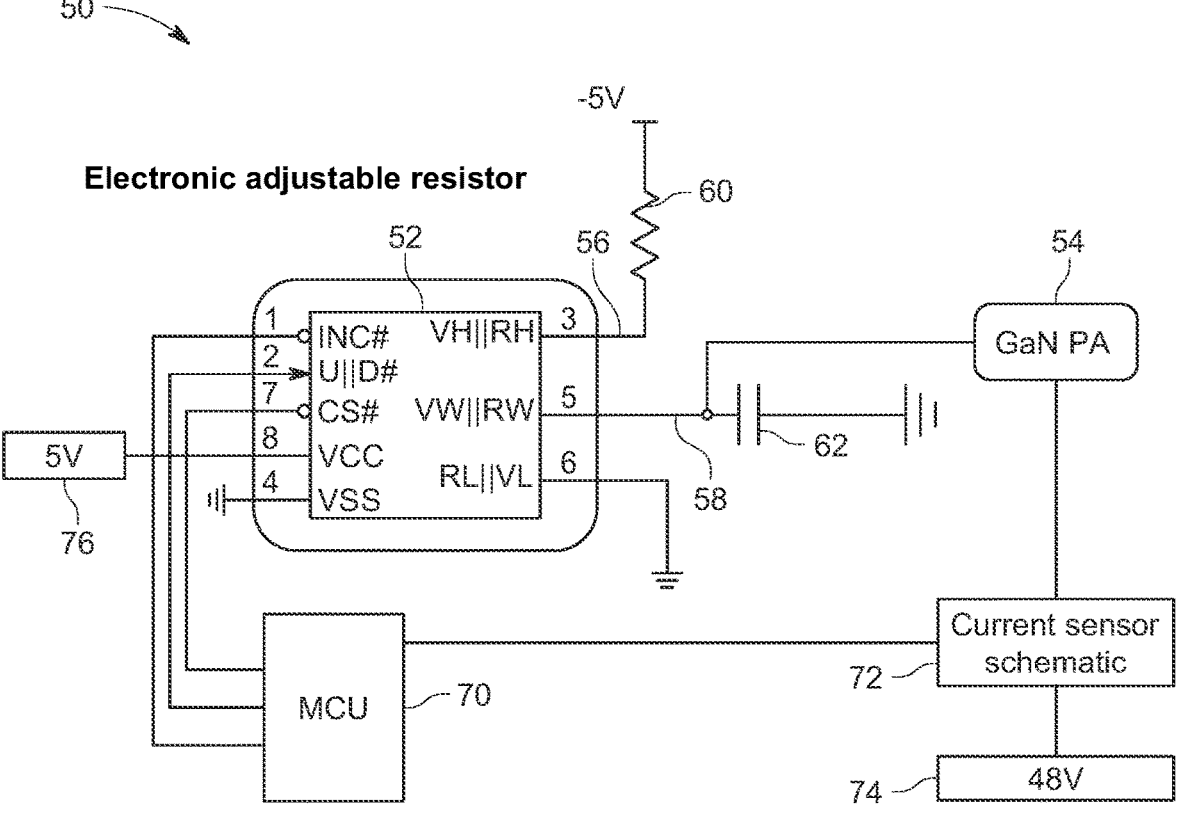
FIG. 1B is a circuit diagram of a prior art electronic adjustable resistor for controlling quiescent current of a GaN power amplifier.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure relates to a tunable electronic circuit that has a dedicated printed circuit board for an electronic adjustable resistor integrated circuit. The printed circuit board has a bias voltage output circuit coupled to the GaN power amplifier. The value of the electronic adjustable resistor determines the bias voltage level. A micro-controller unit (MCU) on a test fixture determines the quiescent current and resulting voltage bias necessary to adjust the quiescent current of the GaN power amplifier during the production process. The MCU then takes the desired voltage bias and determines the corresponding resistance on the voltage output circuit for the desired voltage bias. The MCU then sets the value of the adjustable resistor to the corresponding resistance. The value of the resistance is stored by the resistor integrated circuit. The present disclosure combines the advantage of mechanical and electronic adjustable resistor, including less trace routing space on the printed circuit board. The setting of the resistance value of the electronic adjustable resistor can be automated to facilitate mass production. The disclosed process reduces the cost by avoiding the need to install an MCU on each printed circuit board. The disclosed process eliminates the need to install a MCU and supporting circuitry and traces and therefore eliminates the interference from signals from an MCU and additional necessary traces to RF signals from the power amplifier.

Figure 2:
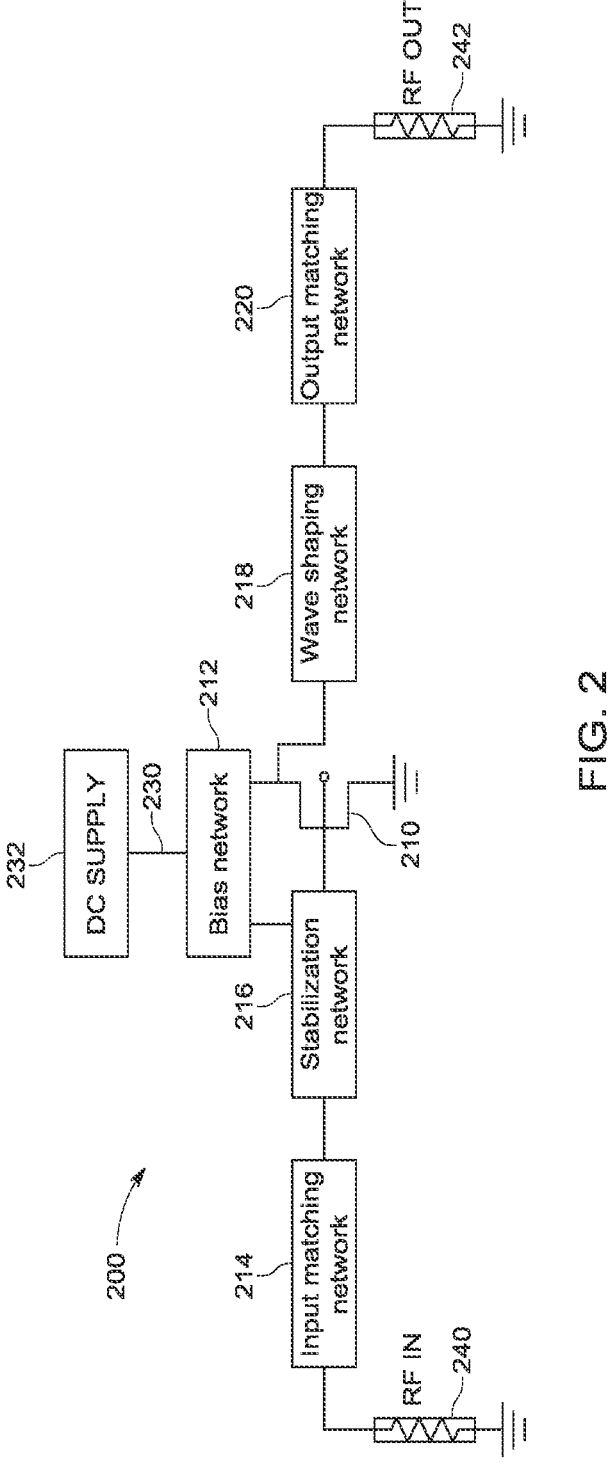
FIG. 2 is a circuit diagram of a GaN power amplifier requiring adjustment of quiescent current, according to certain aspects of the present disclosure.

FIG. 2 is a circuit diagram of an example GaN based RF power amplifier 200 that includes a GaN transistor 210 that performs the amplification of an input RF signal. In this example, the RF power amplifier 200 is the last stage of a transmitter system such as that in a 5G radio unit. The RF power amplifier 200 boosts the power levels of an RF signal before radiating it into space via an antenna. In this example, the RF power amplifier 200 operates at the RF or microwave region of the spectrum and hence requires additional circuits for operating at such frequencies.

The example GaN based RF power amplifier 200 includes the GaN transistor 210, a bias network 212, an input matching network 214, a stabilization network 216, a wave shaping network 218, and an output matching network 220. In this example, a DC voltage supply 232 is divided into a gate DC voltage signal and a 48 V DC voltage signal. The RF power amplifier 200 has a bias input 230 that when coupled to the 48 V DC voltage signal from the voltage source 232 allows for adjustment of the gate bias of the GaN transistor 210 to adjust for the quiescent current of the GaN transistor 210. As will be explained, the level of the gate DC voltage signal from the voltage source 232, and thus the bias voltage is tuned by setting an adjustable resistor. The RF power amplifier 200 includes an RF signal input 240 and an RF signal output 242. RF signals are coupled to the RF signal input 240. The GaN transistor 210 serves to amplify the RF signals received through the RF signal input 240 and the resulting amplified RF signal is output through the RF signal output 242.

Figure 3:
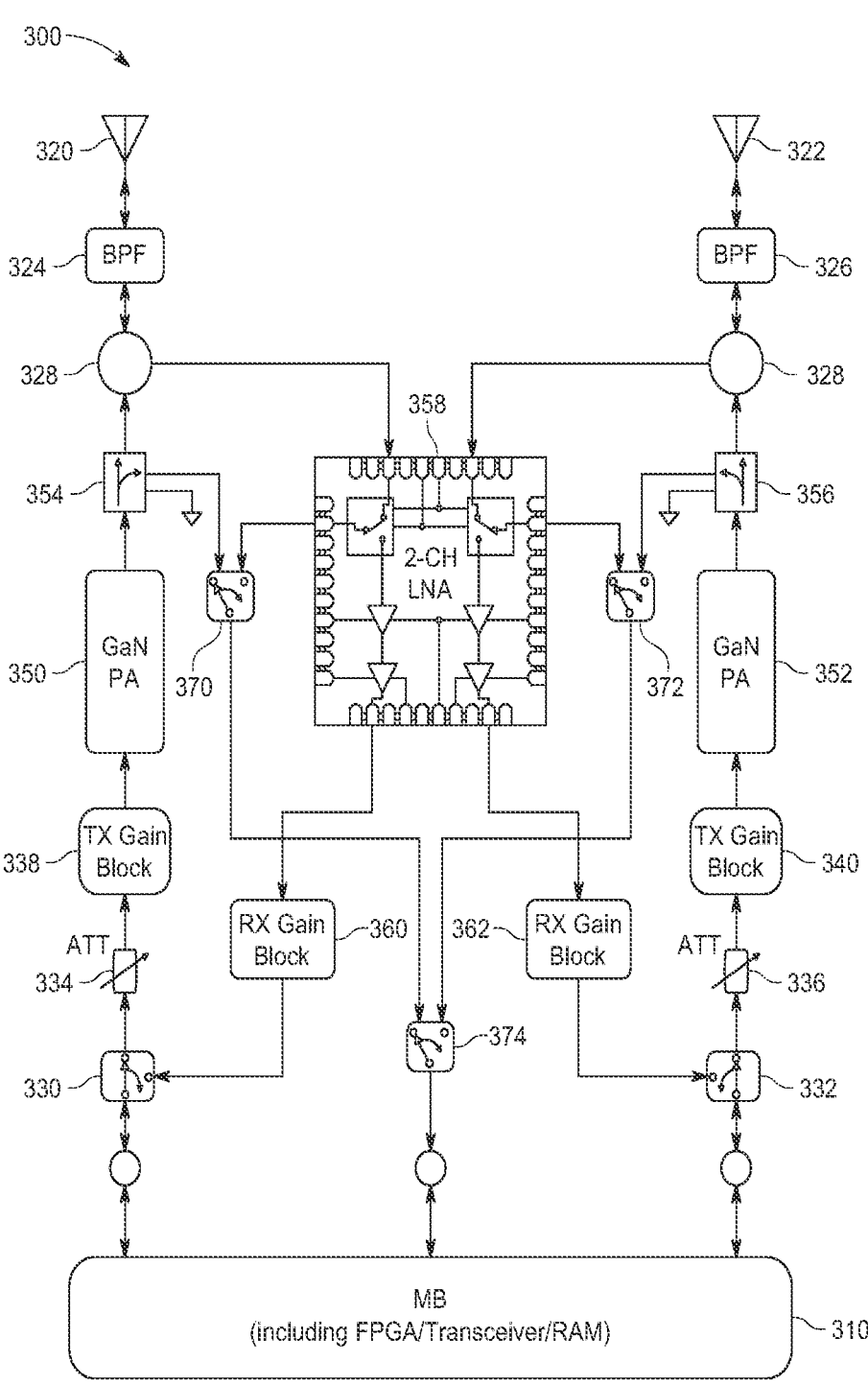
FIG. 3 is a block diagram of an example 5G radio unit employing the power amplifier in FIG. 2, according to certain aspects of the present disclosure.

FIG. 3 is a block diagram of a transceiver system 300 of an example electronic component that requires power amplifiers for transmission of RF signals. In this example, the electronic component is a radio unit (RU) for a 5G network. The transceiver system 300 of the radio unit has a motherboard 310 that includes components such as a controller, transceiver, and memory. In this example the components on the motherboard 310 are used to transmit radio frequency signals and control the transceiver path switching.

In this example, RF signals are transmitted and received via two antennas 320 and 322 that define two communication channels. Radio units may have a single channel or multiple channels with corresponding antennas and support components. The antennas 320 and 322 are coupled to bandpass filters 324 and 326. The bandpass filters 324 and 326 are coupled to circulators 328 that circulate the RF signals to other components of the transceiver system 300.

RF signals for transmission are routed by the components on the motherboard 310 through either of the communication channels through respective switches 330 and 332. The switches 330 and 332 may be controlled to receive RF signals from the antennas 320 and 322 or transmit RF signals from the antennas 320 and 322 through the bandpass filters 324 and 326 and the circulators 328. When RF signals are transmitted, they are routed through adjustable attenuators 334 or 336 to respective transmitter gain blocks 338 and 340. Once the RF signals to be transmitted are output from the transmitter gain blocks 338 and 340, they are routed to the RF inputs of respective power amplifiers of power amplifier modules 350 and 352. In this example, the power amplifiers of the power amplifier modules 350 and 352 are similar to the GaN based RF power amplifier 200 in FIG. 2 and thus serve to amplify the RF signals that are transmitted from the antennas 320 and 322. The resulting amplified RF signals from the power amplifier modules 350 and 352 are routed through respective couplers 354 and 356 to the bandpass filters 324 and 326 for transmission through the respective antennas 320 and 322.

RF signals received by the antennas 320 and 322 are filtered by the respective bandpass filters 324 and 326. The RF signals are then fed into a two-channel low noise amplifier 358. The outputs of the low noise amplifier 358 are fed into respective receiver gain blocks 360 and 362. The outputs of the receiver gain blocks 360 and 362 are routed through the respective switches 330 and 332 to the components on the motherboard 310. Transmitted signals are monitored by couplers 354 and 356, and then fed into corresponding switches 370 and 372. Both signals are routed from the switches 370 and 372 through inputs of the respective switch 374 to the components on the motherboard 310 for monitoring the transmitted signals. The signal reflected back after passing through the TX gain blocks 338 and 340 to the antennas 320 and 322 will pass through the switches of the low noise amplifier 358, and are then fed to the inputs of switches 370 and 372. These switches 370 and 372 will route the received signals to the inputs of respective switch 374 to the components on the motherboard 310 for receiving the reflected signal of the TX gain blocks 338 and 340.

Figure 4:
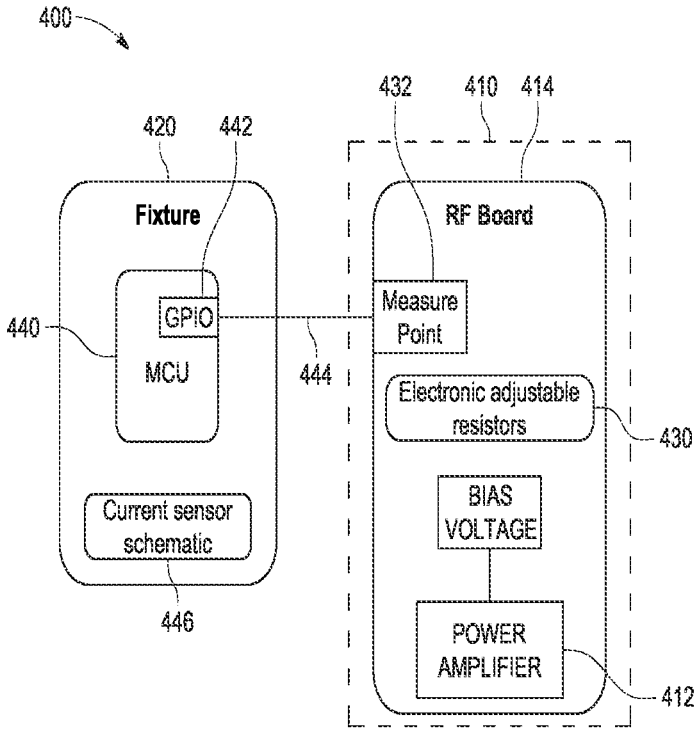
FIG. 4 is a layout diagram of the components of an example test fixture support system for setting an electronic adjustable resistor to adjust the quiescent current of a GaN power amplifier, according to certain aspects of the present disclosure.

FIG. 4 is a block diagram of a manufacturing system 400 that is used to manufacture an electronic component 410 such as a radio unit. The electronic component 410 includes a power amplifier 412 on an RF printed circuit board 414. The manufacturing system 400 includes a test fixture 420 that is used to set the resistor value in a voltage circuit to supply a voltage bias level to adjust the quiescent current for the GaN transistor of the power amplifier 412. In this example, the test fixture 420 may be used to set the resistor values for all power amplifiers on the electronic component during production. Thus, the test fixture 420 is part of the assembly process and may be employed as part of the assembly process for production of multiple components identical to the electronic component 410.

The RF printed circuit board 414 has an electronic adjustable resistor integrated circuit 430 that is coupled to the power amplifier 412 to control a bias voltage input. As explained above, a radio unit may have several power amplifiers including the power amplifier 412. The RF printed circuit board 414 may thus include several electronic adjustable resistor integrated circuits such as the electronic adjustable resistor integrated circuit 430 for providing voltage bias inputs to each of the corresponding power amplifiers on the RF printed board 414 such as the power amplifier 412. A measure point 432 is formed on the RF printed circuit board 414 corresponding to the inputs of the electronic adjustable resistor integrated circuit 430. The measure point 432 is coupled to the control signal inputs of the electronic adjustable resistor integrated circuit 430.

The test fixture 420 includes a MCU 440 that is programmed to measure quiescent current from the power amplifier 412, determine the appropriate bias voltage to adjust the quiescent current, and determine a resistance value for the electronic adjustable resistor integrated circuit 430 to output the appropriate bias voltage. The MCU 440 includes a general purpose input/output (GPIO) pin 442 that is connected to the measure point 432 through a test probe 444 that is placed in contact with the measure point 432 to input the resistance value to the electronic adjustable resistor integrated circuit 430. The test fixture 420 includes a current sensor module 446 that determines the quiescent current of the GaN transistor in the power amplifier 412. The Power Amplifier is on the RF board. The test fixture 420 includes a power supply that is part of the current sensor module 446. The current from the current sensor module 446 will be monitored by the MCU 440 in the test fixture 420. In this example, the power supply on the current sensor module 446 can be regarded as a current sensor. The quiescent current of the transistor of the power amplifier 412 may be obtained from the power supply in the current sensor module 446. The MCU 440 reads the quiescent current from the current sensor module 446.

The MCU 440 in the test fixture 420 can set the resistance value of the electronic adjustable resistor integrated circuit through the measure point 432 and thus a bias voltage is provided to adjust for the quiescent current of the power amplifier 412 when the electronic component 410 is in operation. After the MCU 440 completes the adjustment of the resistor value of the electronic adjustable resistor integrated circuit 430, the test probe 444 is disconnected from the measure point 432. The test probe 444 may then be moved to another measure point for another adjustable electronic resistor integrated circuit and corresponding power amplifier of the electronic component 410. After setting all of the required resistor values for biasing all power amplifiers on the electronic component 410, the electronic component 410 can then be moved to the next stage of production. The test fixture 420 may then perform the testing and adjustment steps for the power amplifier of another production component. The RF printed circuit board 414 on the final product only has the electronic adjustable resistor integrated circuit 430 and components to output the bias voltage to the power amplifier 412, thus minimizing surface traces required.

Figure 5:
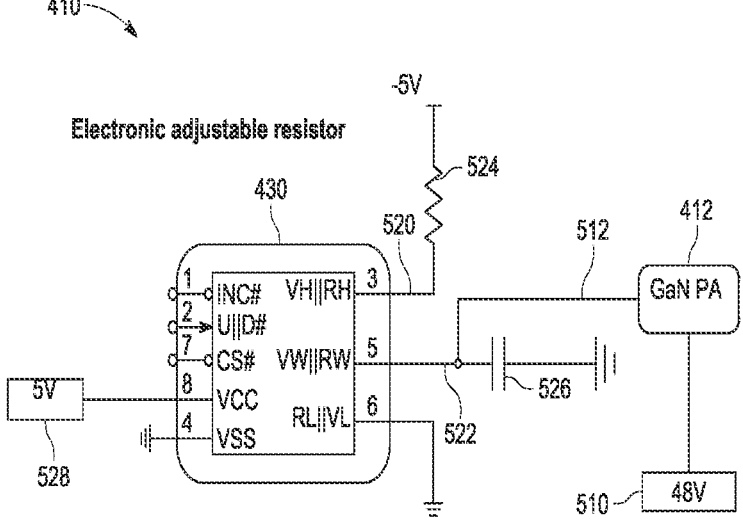
FIG. 5 is a circuit diagram of an example GaN power amplifier and adjustable resistor on a computer component, according to certain aspects of the present disclosure.

FIG. 5 is a circuit diagram of the support circuits for the electronic adjustable resistor integrated circuit 430 that are installed on the RF printed circuit board 414 in FIG. 4. A power source 510 such as a 48 volt power source is coupled to the power amplifier 412. As explained above, the internal resistance between pins 520 and 522 of the electronic adjustable resistor integrated circuit 430 is set by the MCU 440 of the test fixture 420 in FIG. 4. A bias pin 512 of the power amplifier 412 is connected to the pin 522 of the electronic adjustable resistor integrated circuit 430. The pin 520 of the electronic adjustable resistor integrated circuit 430 is coupled via a resistor 524 to a voltage source. The resistance between the pins 520 and 522 determines the voltage output from the pin 522. Thus, the circuit may be set to a bias voltage tuned to adjust the quiescent current of the GaN transistor in the power amplifier 412.

The internal resistor value stored by the electronic adjustable electronic resistor integrated circuit 430 provides an output voltage at the pin 522. The output voltage of the pin 522 is thus selected via the resistance value. The voltage output of the pin 522 is coupled to the bias pin 512 of the RF power amplifier 412. This signal is smoothed via a capacitor

526. The voltage output serves to bias the GaN transistor of the power amplifier 412. A low voltage source 528, 5 volts in this example, provides power to the electronic adjustable resistor integrated circuit 430.

Figure 6:
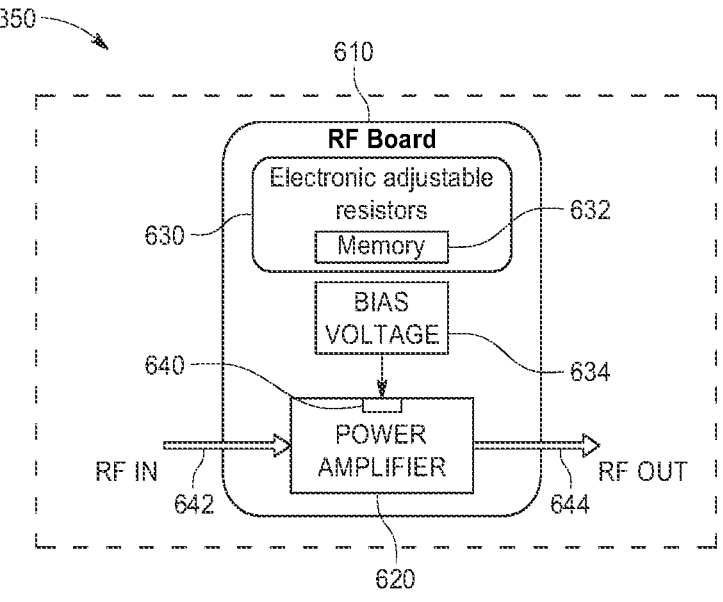
FIG. 6 is a block diagram of an example adjustable resistor for a GaN power amplifier on the radio unit in FIG. 3, according to certain aspects of the present disclosure.

FIG. 6 is a block diagram of the power amplifier module 350 in the transceiver system 300 of the radio unit in FIG. 3 after undergoing the manufacturing process performed by the manufacturing system 400 in FIG. 4. The power amplifier module 350 includes a RF circuit board 610. The RF circuit board 610 includes a GaN power amplifier 620 and an electronic adjustable resistor integrated circuit 630. The electronic adjustable resistor integrated circuit 630 includes a permanent memory 632 (e.g., a non-volatile memory) that stores a resistive value. The resistive value is determined and stored by the manufacturing system 400 in FIG. 4. The electronic adjustable resistor integrated circuit 630 is part of a bias voltage circuit 634 that supplies a bias voltage to the GaN power amplifier 620. The resistive value stored in the permanent memory 632 determines the voltage supplied by the bias voltage circuit 634. As explained above, the bias voltage is tuned by the manufacturing system 400 to adjust for the specific quiescent current of the GaN transistor in the GaN power amplifier 620 for the GaN power amplifier 620 to properly operate at the desired frequency range of RF input signals.

The GaN power amplifier 620 has a bias voltage pin 640 that is coupled to the bias voltage circuit 634. The GaN power amplifier 620 receives an RF signal through an RF input 642. The RF signal is amplified and output through an RF output 644. The bias voltage applied to the gate of the GaN transistor enables the GaN transistor to operate in the desired frequency range for RF signals.

The manufacturing system 400 combines the advantages of mechanical and electronic adjustable resistors for adjusting quiescent currents for GaN based power amplifiers. The advantages of providing the automatic adjustment of resistance for bias voltage include requiring less trace routing space on the printed circuit board. Setting the electronic adjustable resistor can be automated to facilitate mass production. This also reduces production costs by not requiring a separate MCU for each electronic device. Finally, the process eliminates the interference of RF signals from the MCU and the corresponding additional traces on the power amplifier.

Figure 7:
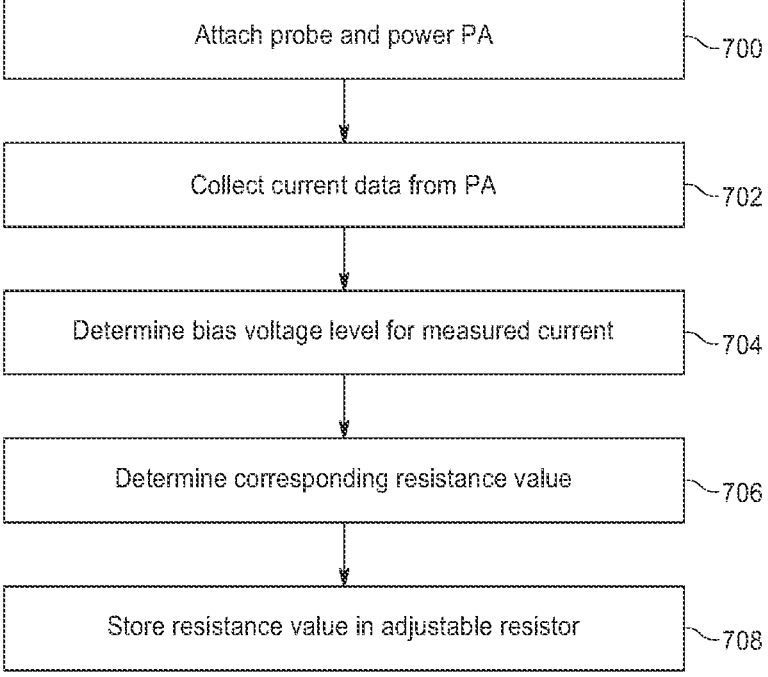
FIG. 7 is a flow diagram of the production process for setting an electronic adjustable resistor for providing voltage bias for a GaN power amplifier, according to certain aspects of the present disclosure.

FIG. 7 shows a flow diagram of a routine executed by the MCU 440 of the manufacturing system 400 in FIG. 4. In this example, the machine readable instructions comprise an algorithm for execution by: (a) a processor, (b) a controller, and/or (c) one or more other suitable processing device(s). The algorithm may be embodied in software stored on tangible media such as flash memory, CD-ROM, floppy disk, hard drive, digital video (versatile) disk (DVD), or other memory devices. However, persons of ordinary skill in the art will readily appreciate that the entire algorithm and/or parts thereof can alternatively be executed by a device other than a processor and/or embodied in firmware or dedicated hardware in a well-known manner (e.g., it may be implemented by an application specific integrated circuit [ASIC], a programmable logic device [PLD], a field programmable logic device [FPLD], a field programmable gate array [FPGA], discrete logic, etc.). For example, any or all of the components of the interfaces can be implemented by software, hardware, and/or firmware. Also, some or all of the machine readable instructions represented by the flowchart may be implemented manually. Further, although the example algorithm is described with reference to the flowcharts illustrated in FIG. 7, persons of ordinary skill in the art will readily appreciate that many other methods of implementing the example machine readable instructions may alternatively be used. For example, the order of execution of the blocks may be changed, and/or some of the blocks described may be changed, eliminated, or combined.

The routine first attaches a probe to the measure point on the RF board of the electronic component (700). The routine then provides power to the power amplifier on the component. The routine then measures the quiescent current from the power amplifier through the current sensor on the test fixture (702). The measured quiescent current reflects the specific characteristics of the GaN transistor in the power amplifier. The routine determines the bias voltage level to adjust for the measured quiescent current of the GaN transistor (704). The routine then determines the resistance value that corresponds to the determined bias voltage level (706). The routine then stores the determined resistance value in the electronic adjustable resistor (708). This is performed by sending the command signal and resistance value data to the input pins of the electronic adjustable resistor integrated circuit. The routine is repeated for each electronic device produced by the manufacturing system.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

What is claimed is:

1. A power amplifier system, comprising:
a voltage source;
a circuit board with an electronic variable resistor integrated circuit including a preset resistance value and a measure point coupled to the electronic variable resistor integrated circuit allowing a micro-controller unit of a test fixture to set the predetermined resistance value in the electronic variable resistor integrated circuit, the electronic variable resistor integrated circuit coupled to the voltage source for outputting a bias voltage; and
a power amplifier including a GaN transistor and a bias input coupled to the electronic variable resistor integrated circuit, wherein the preset resistance value is determined by a quiescent current of the GaN transistor measured by the micro-controller unit of the test fixture from the measure point prior to installation of the power amplifier in an electronic device.

2. The power amplifier system of claim 1, wherein the preset resistance value is stored in a memory on the electronic variable resistor integrated circuit.

3. The power amplifier system of claim 1, wherein a current sensor determines the quiescent current of the GaN transistor.

4. The power amplifier system of claim 1, wherein the power amplifier includes an RF input and an RF output, wherein an RF signal input to the RF input is amplified by the power amplifier.

5. A transceiver device comprising:

a circuit board including a first electronic adjustable resistor and a first voltage output; and a voltage source coupled to the first electronic adjustable resistor to output a first predetermined bias voltage at the first voltage output; and a first GaN power amplifier including a GaN transistor and a bias voltage input to adjust for a quiescent current of the GaN transistor, the bias voltage input coupled to the first electronic adjustable resistor, wherein the first electronic adjustable resistor is set at a first predetermined resistance value to produce the first predetermined bias voltage, the first predetermined bias voltage value determined by measuring the quiescent current of the GaN transistor of the first GaN power amplifier during production of the transceiver device.

6. The transceiver device of claim 5, further comprising a first antenna transmitting an RF signal, wherein the transceiver device is a 5G radio unit and wherein the first GaN power amplifier includes an RF input and an RF output coupled to the first antenna, and wherein an RF signal coupled to the RF input is amplified by the power amplifier.

7. The transceiver device of claim 6, further comprising:

a second antenna; and a second GaN power amplifier including a GaN transistor, an RF input, an RF output coupled to the second antenna, and a bias voltage input to adjust for a quiescent current of the GaN transistor, wherein the circuit board includes a second electric adjustable resistor and a second voltage output, the bias voltage input of the second power amplifier coupled to the second electronic adjustable resistor, wherein the second electronic adjustable resistor is set at a second predetermined resistance value to produce a second predetermined bias voltage, the second predetermined bias voltage value determined by measuring the quiescent current of the GaN transistor of the second GaN power amplifier during production of the transceiver device.

8. The transceiver device of claim 5, wherein the first predetermined resistance value is stored in a memory on the first electronic adjustable resistor.

9. The transceiver device of claim 5, wherein a current sensor determines the quiescent current of the GaN transistor of the first GaN power amplifier during production of the transceiver device.

10. The transceiver device of claim 5, wherein the circuit board includes a measure point coupled to the first electronic variable resistor allowing a micro-controller unit of a test fixture to set the predetermined resistance value in the first electronic variable resistor.

11. A method of setting an adjustable resistor for adjusting quiescent current in a GaN transistor of a power amplifier on a production component, the method comprising:

measuring a quiescent current on the GaN power amplifier via a micro-controller unit coupled to a current sensor on a test fixture including a measure point coupled to an electronic adjustable resistor;

determining a resistance value for outputting of a bias voltage value to adjust for the quiescent current of the GaN transistor via the micro-controller unit;

storing the resistance value in the electronic adjustable resistor via the micro-controller unit; and coupling the electronic adjustable resistor to an output voltage circuit to provide voltage at the bias voltage value to a voltage bias input of the power amplifier.

12. The method of claim 11, wherein the electronic adjustable resistor includes a memory for storing the resistance value.

13. The method of claim 11, wherein the power amplifier includes an RF input and an RF output, wherein an RF signal is amplified by the power amplifier.

14. The method of claim 13, wherein the production component is a 5G radio unit.

15. The method of claim 11, wherein the production component is one of a plurality of production components, wherein the measuring, determining, and storing are performed by the test fixture as part of a production system.

\* \* \* \* \*